United States Patent
Yamada

(10) Patent No.: US 6,304,203 B1
(45) Date of Patent: Oct. 16, 2001

(54) SUCCESSIVE APPROXIMATION AD CONVERTER AND MICROCOMPUTER INCORPORATING THE SAME

(75) Inventor: Susumu Yamada, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/631,260

(22) Filed: Aug. 3, 2000

(30) Foreign Application Priority Data

Aug. 6, 1999 (JP) .................................................. 11-223349

(51) Int. Cl.[7] ...................................................... H03M 1/36
(52) U.S. Cl. .......................... 341/159; 341/150; 341/154; 341/155; 341/163; 341/172; 341/161
(58) Field of Search .................................... 341/159, 150, 341/154, 155, 161, 163, 172

(56) References Cited

U.S. PATENT DOCUMENTS

| | | | |
|---|---|---|---|
| 5,757,303 | * 5/1998 | Nakatani et al. | ...................... 341/159 |
| 5,818,379 | * 10/1998 | Kim | ....................... 341/159 |
| 5,936,437 | * 8/1999 | Kusumoto et al. | ...................... 327/94 |
| 5,936,566 | * 8/1999 | Part | ....................... 341/159 |

FOREIGN PATENT DOCUMENTS 06120829    4/1994   (JP) .
10163873    6/1998   (JP) .

* cited by examiner

Primary Examiner—Michael Tokar
Assistant Examiner—Lam T. Mai
(74) Attorney, Agent, or Firm—Fish & Richardson P.C.

(57) ABSTRACT

A successive approximation AD converter is provided which can produce an (m+n)-bit digital signal having high AD conversion accuracy, by using a series resistor network having m-bit resolution. A successive approximation AD converter has: a switch 4 which switches a reference voltage from a series resistor network 1 either to be supplied to an input node of a comparator or not to be supplied to the input node; a switch group 7 consisting of an n number of switches which selectively connect an n number of capacitors of a capacitor group 8 to the input node 6 of the comparator 5; and a control circuit 9 which controls on/off operations of the switch 4 and the n number of switches of the switch group 7. After conversion to an m-bit digital signal is, ended, in accordance with a result of the comparison by the comparator 5, the control circuit 9 controls the on/off operations of the switch 4 and the n number of switches of the switch group 7, thereby generating plural intermediate reference voltages which are obtained by dividing a reference voltage Vj generated from the series resistor network 1.

12 Claims, 3 Drawing Sheets

SUCCESSIVE APPROXIMATION AD CONVERTER AND MICROCOMPUTER INCORPORATING THE SAME

BACKGROUND OF THE INVENTION

The present invention relates to a successive approximation type AD (analog-to-digital) converter, and more particularly to a successive approximation AD converter in which the AD conversion accuracy can be improved without increasing the number of resistors of a series resistor network for generating reference voltages for a comparator.

A microcomputer which is incorporated into an electronic apparatus, an industrial apparatus, or the like repeatedly performs the following control operation in order to control the operation of the apparatus. The microcomputer fetches a data indicating that the apparatus is in a certain state, performs a predetermined calculation process on the data, and causes the apparatus to sequentially operate by using a calculation data obtained as a result of the calculation.

In the microcomputer, the calculating process is performed in binary format, and hence there arises no problem when the calculating process is performed with fetching digital data from the external. By contrast, in the case where the calculating process is performed with fetching an analog signal, an AD converter for converting the analog signal into a digital signal most be incorporated between an input port of the microcomputer and the CPU (Central Processing Unit).

Analog-to-digital converters (hereafter called as AD converter) are classified into a batch approximation type and a successive approximation type. Hereinafter, a converter of the latter type or a successive approximation AD converter will be briefly described. When an analog signal is to be converted into an m-bit digital signal, for example, a successive approximation AD converter requires: a $2^m$ number of resistors which are connected in series between a power source Vdd and the ground; a comparator which sequentially compares the analog voltage with node voltages of a specific m number of the series resistors; and an m-bit register which holds a comparison output of the comparator.

The successive approximation AD converter operates in the following manner. First, the analog signal is compared with a center voltage Vdd/2 of the power source voltage Vdd and the ground. If the analog signal is higher than Vdd/2, "1" is held in the most significant bit of the register. Since it is found that the analog signal exists in (Vdd/2 to Vdd), the analog signal is then compared with a center voltage 3Vdd/4 of (Vdd/2 to Vdd). If the analog signal is lower than 3Vdd/4, for example, the comparison output "0", is held in the second significant bit of the register. Since it is found that the analog signal exists in (Vdd/2 to 3Vdd/4), the analog signal is further compared with a center voltage 5Vdd/8 of (Vdd/2 to 3Vdd/4). If the analog signal is higher than 5Vdd/8, for example, the comparison output "1" is held in the third-significant bit of the register. An operation similar to the above is repeated until the bit reaches the least significant bit of the register, whereby an m-hit digital value corresponding to the analog signal is held by the register. The microcomputer fetches the contents of the register and then performs a desired calculation process.

The case where the resolution of the successive approximation AD converter is to be changed to (m+n) bits in order to improve the AD conversion accuracy will be considered. In such a case, conventionally, a countermeasure is taken in which the number of resistors that are connected in series between the power source Vdd and the ground is increased to $2^{(m+n)}$. When the resolution is to be changed from 8 bits to 10 bits, for example, the number of series resistors must be increased from 256 to 1,024.

When the number of resistors of a series resistor network is increased so as to improve the AD conversion accuracy, however, there arises a problem in that the chip area is largely widened and the production cost is raised.

SUMMARY OF THE INVENTION

It is an object of the invention to provide a successive approximation AD conversion circuit in which the AD conversion accuracy can be improved without increasing the number of resistors of a series resistor network.

It is another object of the invention to provide a successive approximation AD converter which can produces a digital signal of more than a bits by using a series resistor network having m-bit resolution.

It is a further object of the invention to provide a successive approximation AD converter which is suitably incorporated into a microcomputer that fetches an analog signal and performs a calculation process on the signal.

In a first aspect of the invention, a successive approximation AD converter is a converter in which an analog signal is successively compared with a reference voltage by a comparator to be converted into a digital signal, wherein the converter comprises: a reference voltage generating circuit which generates plural reference voltages including first and second reference voltages; a switch which switches the plural reference voltages either to be supplied to an input node of the comparator or not to be supplied to the input node; a capacitor group consisting of an n (n is a natural number which is equal to or larger than 2) number of capacitors; a switch group consisting of an n number of switches which selectively connect the n number of capacitors in parallel to the input node of the comparator; and a control circuit which controls on/off operations of the switch and the n number of switches, in accordance with a result of the comparison by the comparator, the control circuit causes plural intermediate reference voltages to be generated at the input node of the comparator, and the comparator successively compares each of the intermediate reference voltages with the analog signal, the intermediate reference voltages being obtained by dividing the first and second reference voltages.

According to the above means, from the reference voltage which is generated by the reference voltage generating circuit, further plural reference voltages can be newly generated. Unlike the conventional art example, the AD conversion resolution can be improved without involving large widening of the chip area.

In a second aspect of the invention, a successive approximation AD converter is a converter in which an analog signal is successively compared with a reference voltage by a comparator to be converted into a digital signal, wherein the converter comprises: a series resistor network which is configured by connecting in series resistors of a number required for obtaining an m-bit digital signal, and which generates plural reference voltages; a switch which switches the plural reference voltages generated by the series resistor network either to be supplied to an input node of the comparator or not to be supplied to the input node; a capacitor group consisting of an n (n is a natural number which is equal to or larger than 2) number of capacitors; a switch group consisting of an n number of switches which selectively connect the n number of capacitors in parallel to the input node of the comparator; and a control circuit which controls on/off operations of the switch and the n number of switches, during a period when the analog signal is converted to a corresponding m-bit digital signal, the control circuit maintains the switch to an on state, and the n number of switches to an off state, and after the conversion is ended, controls on/off operations of the switch and the number of switches in accordance with a result of the comparison by the comparator, thereby causing plural intermediate reference voltages to be generated at the input node of the comparator, the intermediate reference voltages being obtained by dividing the reference voltages generated by the series resistor network, and the comparator successively compares each of the intermediate reference voltages with the analog signal, thereby converting the analog signal into an (m+n) bit digital signal.

According to the above means, it is possible to provide a successive approximation AD converter which can produce an (m+n)bit digital signal having high AD conversion accuracy, by using a series resistor network having m-bit resolution.

In a third aspect of the invention, a successive approximation AD converter is a converter in which an analog signal is successively compared with a reference voltage by a comparator to be converted into a digital signal, wherein the converter comprises: a reference voltage generating circuit which generates plural reference voltages including first and second reference voltages V1 and V2; a first switch which switches the plural reference voltages either to be supplied to an input node of the comparator or not to be supplied to the input node; first and second capacitors; second and third switches which selectively connect the first and second capacitors to the input node of the comparator;, and a control circuit which controls on/off operations of the first, second, and third switches, in accordance with a result of the comparison by the comparator, the control circuit divides the first and second reference voltages V1 and V2, and causes plural intermediate reference voltages V indicated by a following expression:

$$V = V1 + \Delta V(A_n/2^n + A_{n-1}/2^{n-1} + \ldots + A_0/2)$$

where $\Delta V = V2 - V1$, $A_j$ (j=0 to n) is 0 or 1, and n is a natural number which is equal to or larger than 1, to be generated at the input node of the comparator, and the comparator successively compares each of the intermediate reference voltages V with the analog signal.

According to such means, the use of only the first to third switches and the first and second capacitors enables an AD converter having resolution of an arbitrary bit number to be realized, and the chip area to be largely saved.

In a successive approximation AD converter of a fourth aspect of the invention, the successive approximation AD converter of any one of the first, second, and third aspects of the invention is configured so that the capacitors of the capacitor group, or the first and second capacitors have a same capacitance. Therefore, the AD conversion accuracy can be improved.

In a successive approximation AD converter of a fifth aspect of the invention, the successive approximation AD converter of any one of the first, second, third, and fourth aspects of the invention is configured so that each of the switch, the n number of switches, and the first, second, and third switches is configured by a transmission gate. According to this configuration, the on-resistance of each switch is lowered, and hence correct reference voltages can be generated.

In a sixth aspect of the invention, a microcomputer incorporates the successive approximation AD converter of any one of the first, second, third, fourth, and fifth aspects of the invention.

According to such means, it is possible to provide a microcomputer which fetches an analog signal, performs a calculation process on the signal, and accurately controls an electronic apparatus or the like on the basis of a result of the calculation.

DETAILED DESCRIPTION OF THE PREFERRED EMBODIMENT

First Embodiment

Figure 2:
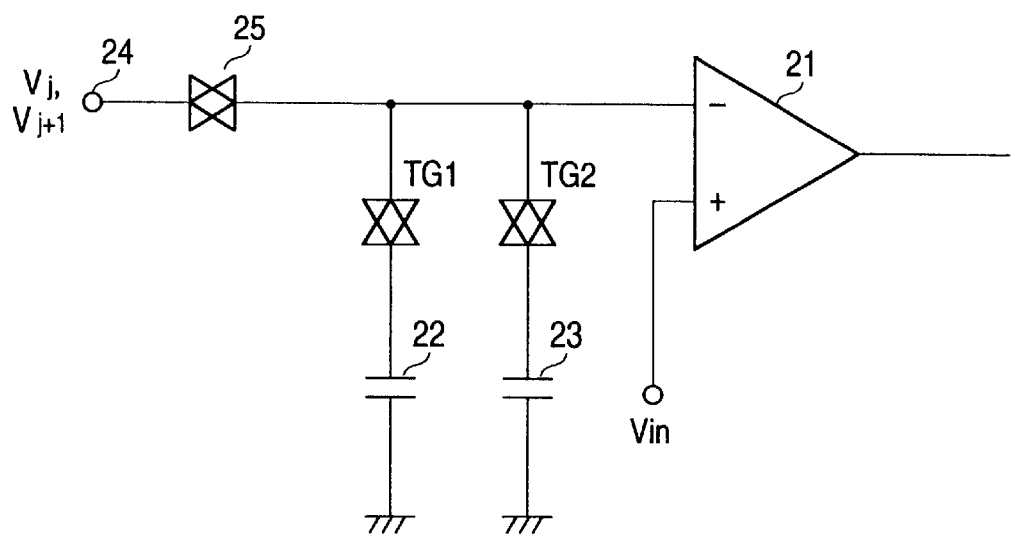
FIG. 2 is a circuit diagram illustrating the principle of a method of generating reference voltages.

At first, the principle of the new-reference voltage generating method which constitutes the characteristic of the invention will be described with reference to FIG. 2. In this example, a method in which two reference voltages $V_j$ and $V_{j+1}$ are used and an intermediate reference voltage between the voltages is generated will be described. It is assumed that $V_j$ <analog signal Vin< $V_{j+1}$. Two capacitors 22 and 23 are connected to an inverting input (−) node of a comparator 21 via the transmission gates TG1 and TG2.

The reference voltage $V_j$ is applied to an input terminal 24, and a switch 25 and the transmission gate TG1 are turned on, so that the reference voltage $V_j$ is applied to the capacitor 22. When TG1 is then turned off, the capacitor 22 holds the reference voltage $V_j$. Thereafter, the reference voltage $V_{j+1}$ is applied to the input terminal 24, and TG2 is turned on, whereby the reference voltage $V_{j+1}$ is applied to the capacitor 23. After the switch 25 is then turned off, TG1 and TG2 are turned on. Then, charges are moved between the capacitors 22 and 23. Finally, the voltage V1 of the inverting input (−) node of the comparator 21 has a value indicated by the following equation:

$$V1 = (C1 V_j + C2 V_{j+1})/(C1+C2)$$

where C1 is the capacitance of the capacitor 22 and C2 is the capacitance of the capacitor 23. It is assumed that C1 and C2 are sufficiently larger than the stray capacitance of the inverting input (−) node of the comparator 21.

When C1=C2=C, $V1=(V_j+V_{j+1})/2$ is attained, or a center voltage of the two reference voltages $V_j$ and $V_{j+1}$ is generated. When the potential difference $(V_{j+1}-V_j)$ between the two reference voltages is indicated as $\Delta V$, the above equation can be expressed as $V1=V_j+\Delta V/2$.

Next, TG2 is turned off, the reference voltage $V_j$ is then applied to the input terminal 24, and the switch 25 is turned on, so that the reference voltage $V_j$ is again applied to the capacitor 22. Next, the switch 25 is turned off and TG2 is turned on, so that charges are moved between the capacitors 22 and 23, thereby, multiplying the sum of $V_j$ and $(V_j+\Delta V/2)$ by ½. As a result, the voltage V2 of the node is $V2=V_j+\Delta V/4$. Namely, a center voltage of $V_j$ and $(V_j+\Delta V/2)$ is generated. Similarly, also a center voltage $V3=V_j+3\Delta V/4$ of $(V_j+\Delta V/2)$ and $V_{j+1}$ can be generated. In this way, the disposition of the two capacitors 22 and 23 and the transmission gates TG1 and TG2 enables the three new intermediate reference voltages to be generated. In this example, the bit resolution of the AD conversion can be improved by 2 bits.

In the method of generating reference voltages, namely, the adding process in which the switch 25 is turned on and a reference voltage is applied to one of the capacitors 22 and 23, and the dividing process in which the switch 25 is turned off and the capacitors 22 and 23 are then connected to each other in parallel to divide the reference voltage stored in the capacitors (in this example, divide by 2) are combined to each other to generate a new intermediate reference voltage.

Figure 1:
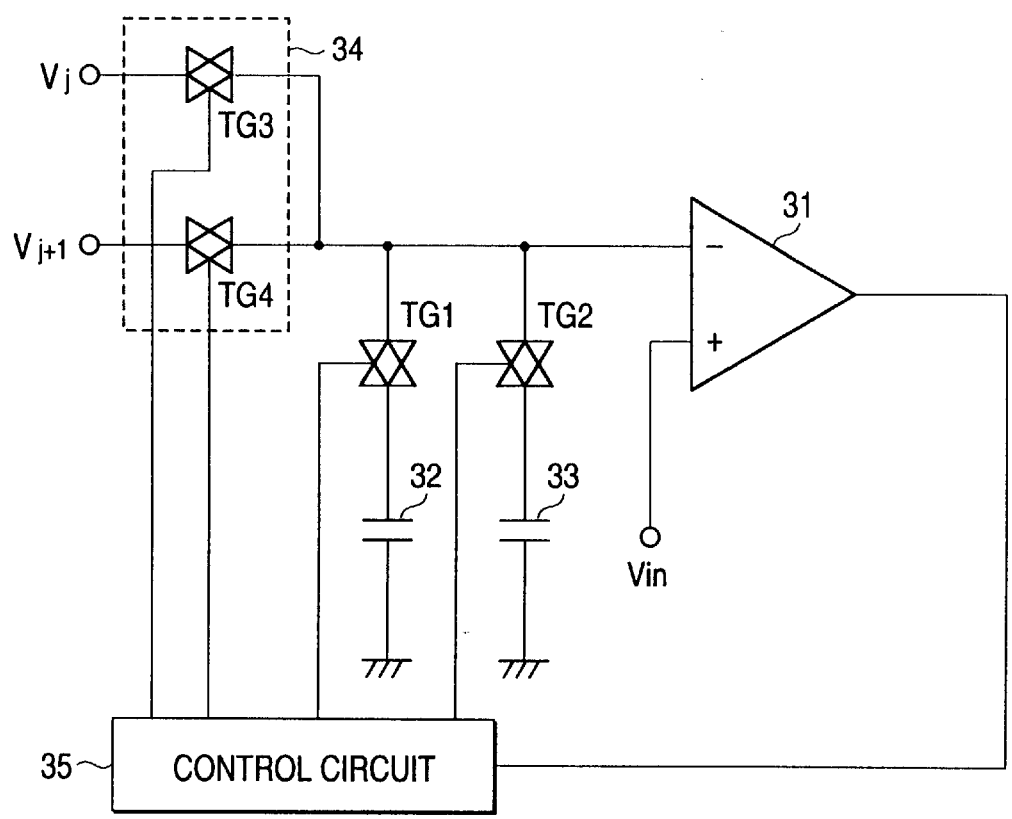
FIG. 1 is a block diagram of a successive approximation AD converter of a first embodiment of the invention.

A first embodiment of the invention will be described with reference to FIG. 1. Two capacitors 32 and 33 are connected to an inverting input (−) node of a comparator 31 via transmission gates TG1 and TG2. The reference numeral 34 denotes a switch which is configured by transmission gates TG3 and TG4 so as to apply one of reference voltages $V_j$ and $V_{j+1}$ to the capacitors 32 and 33. It is assumed that $V_j$<analog signal Vin<$V_{j+1}$. The reference numeral 35 denotes a control circuit which controls the on/off operations of the transmission gates TG1 to TG4 in accordance with an output of the comparator 31.

As apparent from the following description, the successive approximation AD converter can generate plural reference voltages which are obtained by dividing the difference between the two reference voltages, so as to obtain arbitrary bit resolution. For the sake of simplicity, it is assumed that $V_j=0$ and $V_{j+1}=1$. Then, a reference voltage V required for n-bit AD conversion is usually indicated by the following equation:

$$Vn = A_n/2^n + A_{n-1}/2^{n-1} + \ldots + A_0/2$$

where $A_0$ to $A_n$ are 0 or 1.

A reference voltage V required for (n+1)-bit AD conversion is usually indicated by the following expression:

$$Vn+1 = A_{n+1}/2^{n+1} + A_n/2^n + \ldots + A_0/2$$
$$= 1/2((A_{n+1}/2^n + A_n/2^{n-1} + \ldots + A_1/2) + A_0)$$

As described above with reference to FIG. 2, in the method of generating intermediate reference voltages, the adding process and the process of division of ½ are alternatingly performed. By mathematical induction, therefore, it is proved that, when Vn can be generated by the circuit, also Vn+1 can be generated. In other words, arbitrary intermediate reference voltages can be generated by using the circuit shown in FIG. 1.

The embodiment will be further described by using a specific example. A control method in which ⅜ is generated in a 3-bit AD converter will be described.

⅜ is indicated as:

$$3/8 = 1/2^3 + 1/2^2$$
$$= 1/2(1/2^2 + 1/2)$$
$$= 1/2(1/2(1/2 + 1)).$$

In accordance with the procedure indicated by this expression, therefore, ⅜ can be generated by the control circuit 35.

(1) Adding process 1: TG4 is turned on so that 1 is applied to one of the capacitors 32 and 33.

(2) ½ division process 1: TG4 is turned on, and TG1 and TG2 are turned on to produce ½.

(3) Adding process 2: 1 is applied to one of the capacitors 32 and 33, thereby producing (½+1).

(4) ½ division process 2: TG4 is turned off, and TG1 and TG2 are turned on to produce ½(½+1). In the same manner, ½(½(½+1)) is then produced.

The case where ¹³⁄₃₂ is generated in a 5-bit AD converter will be described.

$$13/32 = 1/2^5 + 0/2^4 + 1/2^3 + 1/2^2$$
$$= 1/2(1/2^4 + 1/2^2 + 1/2)$$
$$= 1/2(1/2(1/2^3 + 1/2 + 1)$$
$$= 1/2(1/2(1/2(1/2^2 + 1) + 1))$$
$$= 1/2(1/2(1/2(1/2(1/2+0)+1)+1)).$$

When an adding process and a process of division of ½ are repeated as indicated by this expression, therefore, it is possible to produce ¹³⁄₃₂. The first embodiment is different from a second embodiment (below described) in that an AD converter having arbitrary n-bit resolution is configured by only two capacitors and accompanying switches.

Second Embodiment

Figure 3:
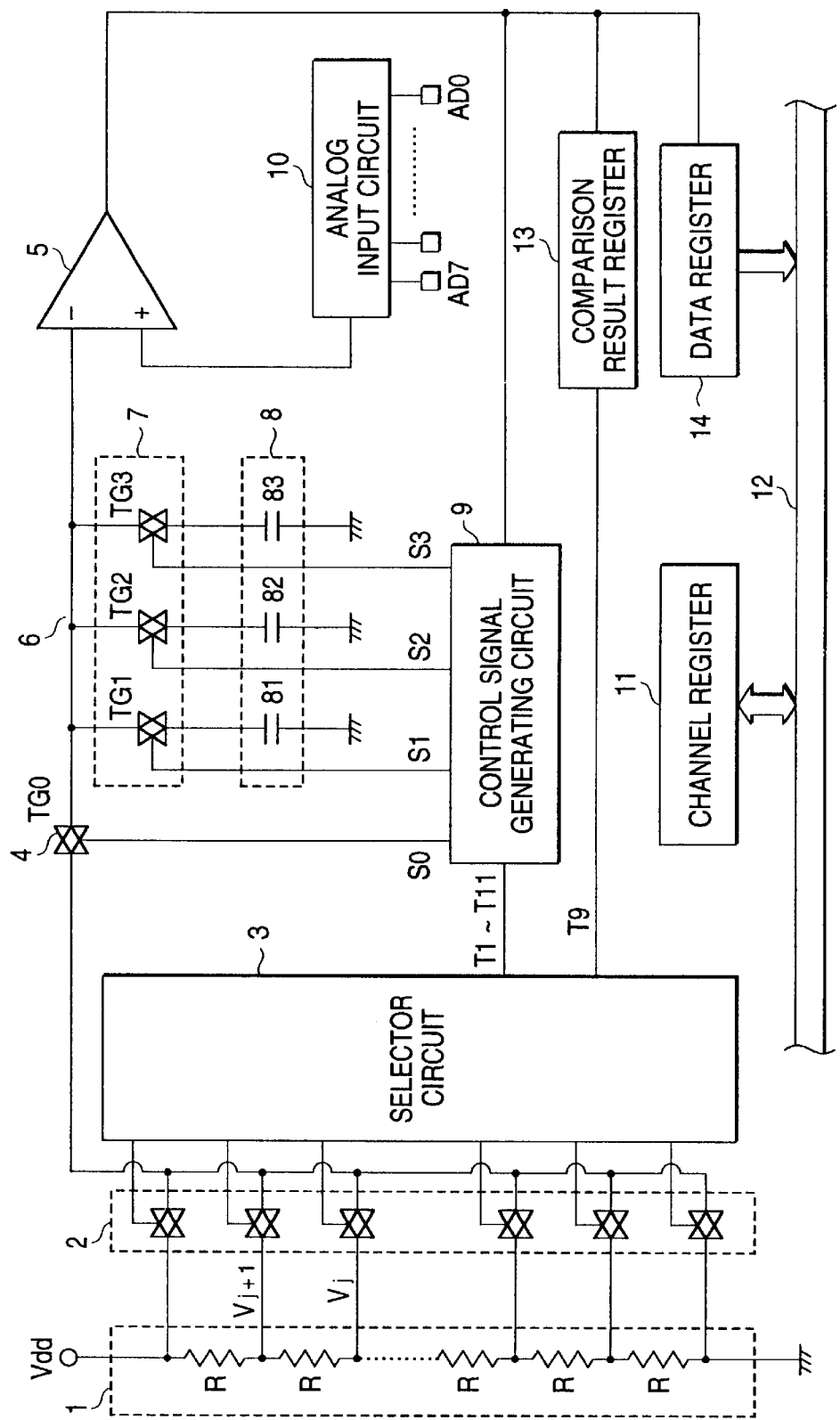
FIG. 3 is a block diagram of a successive approximation AD converter of a second embodiment of the invention.

FIG. 3 is a block diagram showing a successive approximation AD converter of a second embodiment of the invention.

Referring to FIG. 3, 1 denotes a series resistor network of CMOS transmission gates in which a $2^m$ number of resistors having a resistance of R are connected in series between a power source Vdd and the ground. In order to obtain an 8-bit digital signal, for example, 256 resistors are required. A reference voltage which is obtained by dividing the voltage between a power source Vdd and the ground by 256 is output from each of the nodes of the resistors in the series resistor network 1. In the case where the power source Vdd is 5 V, for example, the reference voltages are generated at a pitch of about 20 mV. The successive approximation AD converter of the embodiment is configured so that intermediate reference voltages are generated by further dividing the reference voltages of 20-mV pitches generated by the series resistor network 1, thereby obtaining an 11-bit digital signal.

The reference numeral 2 denotes transmission gates which receive outputs of the reference voltages. In accordance with a select signal which is output from a selector circuit 3, one of the transmission gates is turned on (open state), so that one of the 256 reference voltages is output.

The reference voltage is supplied to an inverting input (−) node 6 of a comparator 5 via a switch 4 which is configured by a transmission gate TG0. Capacitors 81, 82, and 83 (a capacitor group 8) are connected in parallel to the inverting input (−) node 6 of the comparator 5 via a switch group 7 which is configured by transmission gates TG1, TG2, and TG3.

A control signal generating circuit 9 outputs control signals S0 to S3 in accordance with an output of the comparator 5 to control the on/off operations (open/close states) of the transmission gates TG0, TG1, TG2, and TG3. The control signal generating circuit 9 controls the selector circuit 3 in accordance with the output of the comparator 5.

The reference numeral 10 denotes an analog input circuit which supplies an analog signal that is applied to one of, for example, eight analog input terminals AD0 to AD7 disposed in a microcomputer, to the noninverting input terminal (+) of the comparator 5. The reference numeral 11 denotes a 3-bit channel register into which a 3-bit data for selecting one of the analog input terminals AD0 to AD7 is set via a data bus 12.

The reference numeral 13 denotes a comparison result register which holds the least significant hit ("1" or "0") of an 8-bit digital data that is a result of successive approximation performed by the comparator 5. In accordance with the data of the comparison result register 13, the selector circuit 3 controls the transmission gates 2 in the manner described below, in order to further obtain a 3-bit digital data.

The reference numeral 14 denotes a data register which is an 11-bit register for holding the digital signal output from the comparator 5. The digital data is transferred to the data bus 12 to be subjected in a CPU to a calculating process for a predetermined purpose.

Hereinafter, the operation of the successive approximation AD converter shown in FIG. 3 will be described. In the successive approximation AD converter, first, the comparator 5 successively compares the analog signal output from the analog input circuit 10 with the reference voltages output from the series resistor network 1, to obtain the 8-bit digital signal. During the period of this AD conversion, in accordance with the control signals S0 to S3 output from the control signal generating circuit 9, the switch 4 is turned on, and all the transmission gates TG1, TG2, and TG3 are turned off.

Specifically, when a control signal T1 is generated from the control signal generating circuit 9, a center voltage Vdd/2 of the power source voltage Vdd and the ground is applied to the comparator 5 via the transmission gates 2 and the switch 4, and the analog signal is compared with Vdd/2, If the analog signal is higher than Vdd/2, for example, the output of the comparator 5 is "1", and "1" is held in the most significant bit of the data register 14. Since it is found from the output of the comparator 5 that the analog signal exists in (Vdd/2 to Vdd), the control signal generating circuit 9 generates a next control signal T2. Then, a center voltage 3Vdd/4 of (Vdd/2 to Vdd) is applied to the comparator 5, and the analog signal is compared with the center voltage 3Vdd/4. If the analog signal is lower than 3Vdd/4, for example, a comparison output "0" is held in the second significant bit of the data register 14.

Since it is found that the analog signal exists in (Vdd/2 to 3Vdd/4), the control signal generating circuit 9 generates a next control signal T3. Then, a center voltage 5Vdd/8 of (Vdd/2 to 3Vdd/4) is applied to the comparator 5, and the analog signal is compared with the center voltage 5Vdd/8. If the analog signal is higher than 5Vdd/8, for example, a comparison output "1" is held in the third significant bit of the data register 14. An operation similar to the above is repeated for all of the 8 bits, whereby an 8-bit digital signal corresponding to the analog signal is held by the data register 14.

The thus obtained data of the least significant bit is held by the comparison result register 13. If the data of the comparison result register 13 is "1", the data shows that the analog signal Vin is $V_j < Vin < V_{j+1}$ where $V_j$ is the reference voltage which is finally output. By contrast, if the data of the comparison result register 13 is "0", the data shows that the analog signal Vin is $V_{j-1} < Vin < V_j$.

In the new-reference voltage generating method which constitutes a characteristic of the invention and which will be described below, it is necessary to use two reference voltages between which the analog signal Vin exists. Therefore, the selector circuit 3 is controlled so that the two reference voltages are specified on the basis of the data of the comparison result register 13 and the two reference voltages are sequentially output.

Based on the principle of the new reference voltage generating method with reference to FIG. 2, the operation of the actual successive approximation AD converter will be described with reference to FIG. 3. It is assumed that the 8-bit AD conversion is ended and the data of the comparison result register 13 is "1". When the finally output reference voltage is $V_j$, namely, $V_j$<analog signal Vin<$V_{j+1}$ is attained. Furthermore, it is assumed that, in the initial state, the switch 4 is turned on and the transmission gates TG1, TG2, and TG3 are turned off.

On the basis of the data of the comparison result register 13, the selector circuit 3 controls the transmission gate 2 corresponding to the reference voltage $V_j$ so as to be turned on; In accordance with the control signal S1 output from the control signal generating circuit 9, the transmission gate TG1 is turned on, so that the reference voltage $V_j$ is applied to the capacitor 81. Next, on the basis of the control signals S1 and S2, TG1 is turned off, and TG2 is turned on.

In response to a control signal T9 of the control signal generating circuit 9, the selector circuit 3 controls the transmission gate 2 corresponding to the reference voltage $V_{j+1}$ so as to be turned on. As a result, the reference voltage $V_{j+1}$ is applied to the capacitor 82. In accordance with the control signals S0 and S1, the switch 4 is then turned off, and TG1 is turned on. Since both TG1 and TG2 are turned on, the sum of the two reference voltages $V_j$ and $V_{j+1}$ is multiplied by ½. The voltage V1 of the inverting input (−) node 6 of the comparator 5 becomes a center voltage ($V_j+\Delta V/2$). The comparator 5 compares the analog signal with the center voltage ($V_j+\Delta V/2$). If the analog signal is lower than ($V_j+\Delta V/2$), for example, the comparison output "0" is held in the ninth significant bit of the data register 14. After elapse of a time period required for sufficiently stabilizing the inverting input (−) node 6 of the comparator 5, the comparison output "0" is set to the data register 14.

In accordance with the control signals S1, S2, and S3, TG1 and TG2 are then turned off, and TG3 is turned on. In response to a control signal 10 of the control signal generating circuit 9, the selector circuit 3 controls the transmission gate 2 corresponding to the reference voltage $V_j$ so as to be turned on. As a result, the reference voltage $V_j$ is applied to the capacitor 83. In accordance with the control signals S0 and S1, the switch 4 is then turned off, and TG1 is turned on. Since both TG1 and ($V_j+\Delta V/2$) is multiplied by ½. The voltage V2 of the inverting input (−) node 6 of the comparator 5 becomes a center voltage ($V_j+\Delta V/4$) The comparator 5 compares the analog signal with the center voltage ($V_j+\Delta V/4$). If the analog signal is higher than ($V_j+\Delta V/4$), for example, the comparison output "1" is held in the tenth significant bit of the data register 14.

Since it is found that the analog signal exists between ($V_j+\Delta V/4$) and ($V_j+\Delta V/2$), TG1 is turned off in accordance with the control signal S1 while maintaining the state where the switch 4 is turned off. In accordance with the control signal S2, thereafter, TG2 is turned on. As a result, the sum of the two voltages ($V_j+\Delta V/4$) and ($V_j+\Delta V/2$) is multiplied by ½, so that the voltage V3 of the inverting input (−) node 6 of the comparator 5 is ($V_j+3\Delta V/8$). The comparator 5 compares the analog signal with the center voltage ($V_j+3\Delta V/8$). It the analog signal is higher than ($V_j+3\Delta V/8$), for example, the comparison output "1" is held in the eleventh significant bit (the least significant bit) of the data register 14.

If the comparison result of the tenth significant bit shows that the analog signal exists between $V_j$ and ($V_j+\Delta V/4$) (the comparison output is "0"), TG2 is turned on to allow the voltage vito be applied to the capacitor 82, the switch 4 is turned off, and one of TG1 and TG3 is turned on. As a result, $v_j$ and $(V_j+\Delta V/4)$ are set, so that a center voltage $(V_j+\Delta V/8)$ is generated as the voltage V3 of the inverting input (−) node 6 of the comparator 5. The comparator 5 compares the analog signal with the center voltage $(V_j+\Delta V/8)$.

In this way, the successive approximation AD converter of the embodiment can obtain an 11-bit digital signal in which 3 bits are added to an 8-bit digital signal.

Figure 4:
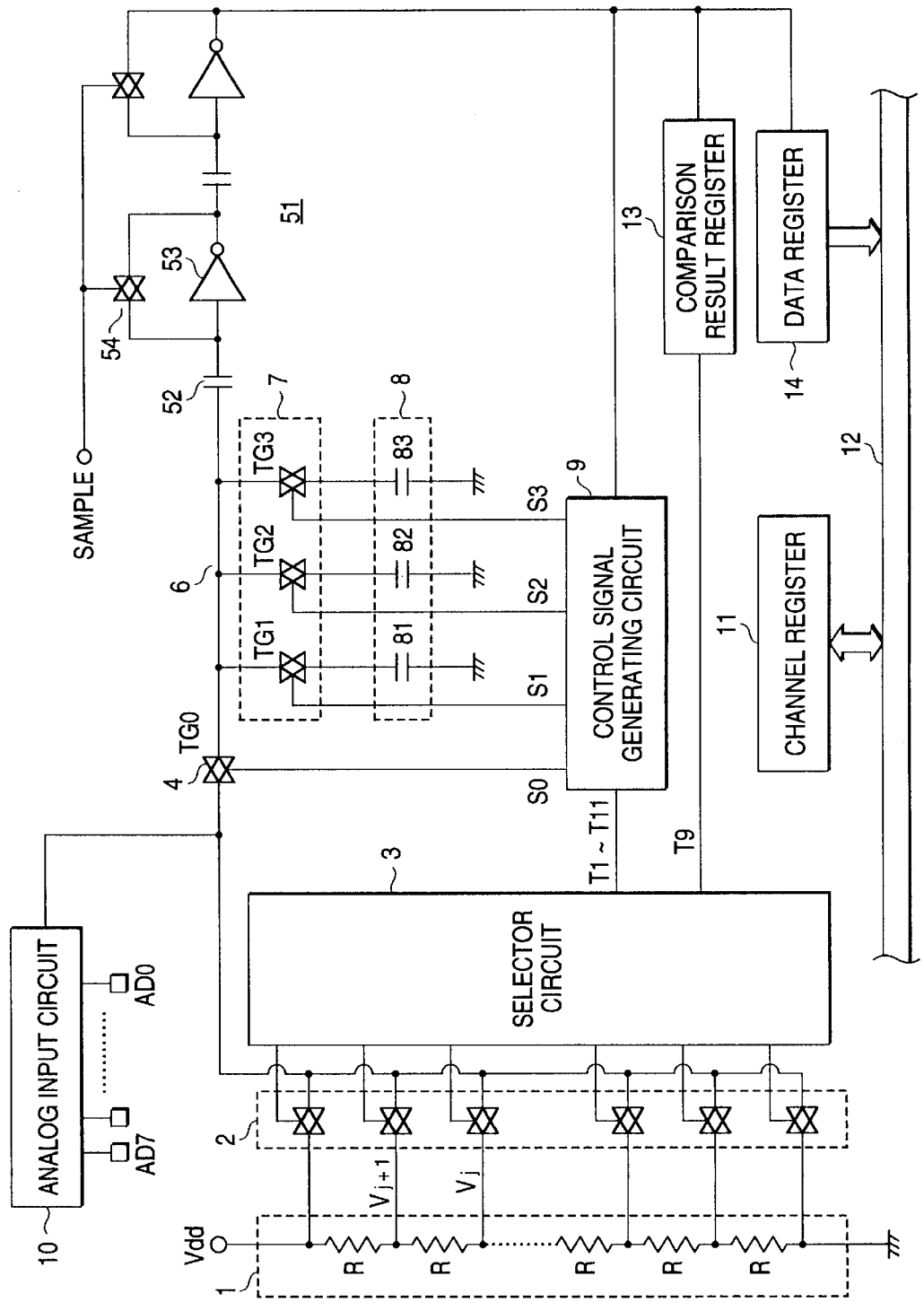
FIG. 4 is a block diagram of a successive approximation AD converter of the second embodiment of the invention.

In the embodiment, a chopper type comparator may be used in place of the differential type comparator 5. FIG. 4 shows the configuration of such a successive approximation AD converter. Referring to the figure, the chopper type comparator 51 is configured by an inverter 53 in which one terminal of a capacitor 52 is connected to the input, and a transmission gate 54 which is connected across the input and the output of the inverter 53. The other terminal of the capacitor 52 is connected to a node 6 of the comparator 51. When a plurality of such chopper type comparators 51 are connected in series, the gain can be increased.

The reference numeral 10 denotes an analog input circuit which supplies an analog signal that is applied to one of, for example, eight analog input terminals AD0 to AD7 disposed in a microcomputer, to the node 6 via the switch 4. The operation of the chopper type comparator 51 will be briefly described.

Based on a sampling signal sample, the transmission gate 54 is turned on. Then, the voltages of the input and the output of the inverter 53 are compulsively set to Vdd/2 which is in the vicinity of the threshold level of the inverter 53. At this time, the analog input circuit 10 applies an analog signal to the capacitor 52 via the switch 4. In response to the sampling signal sample, the transmission gate 54 is thereafter turned off. A reference voltage supplied from the series resistor network 1 is then applied to the capacitor 52 via the switch 4. As a result, the state of the inverter 53 is inverted in accordance with the level difference between the analog signal and the reference voltage. The chopper type comparator 51 fundamentally operates as described above. Even when the comparator 51 is used in place of the comparator 5 shown in FIG. 1, an 11-bit digital signal can be similarly obtained.

In the second embodiment, each time when the number of the switches of the switch group 7, and that of the capacitors of the capacitor group 8 are increased by one, the bit number of a digital signal can be increased by one.

When the capacitance ratios of the capacitors are weighted, arbitrary finer reference voltages can be generated so as to obtain desired bit resolution.

As described above, in the second embodiment, the number of the control steps in the control circuit is minimized by using an n number of capacitors to obtain n-bit resolution. By contrast, in the first embodiment, the bit number of the resolution may not be equal to the number of the capacitors. However, the number of the control steps configured by the adding and ½ dividing processes by the control circuit 35 are larger. Therefore, the successive approximation AD converter of the second embodiment is suitable for high-speed AD conversion, and that of the first embodiment is suitable for the object of reducing the chip area as far as possible.

As described above, according to the invention, a successive approximation AD conversion circuit in which the AD conversion accuracy can be improved without increasing the number of resistors of a series resistor network can be provided.

Furthermore, a successive approximation AD converter which can produces a digital signal of m or more bits and having high AD conversion accuracy by using a series resistor network having m-bit resolution can be provided.

Moreover, a successive approximation AD converter which is suitably incorporated into a microcomputer that fetches an analog signal and performs a calculation process on the signal can be provided.

Moreover, a successive approximation AD converter which has arbitrary n-bit resolution can be provided without using a series resistor network.

What is claimed is:

1. A successive approximation AD converter in which an analog signal is successively compared with a reference voltage by a comparator to be converted into a digital signal, said converter comprising:
    a reference voltage generating circuit which generates plural reference voltages including first and second reference voltages;
    a switch which switches the plural reference voltages either to be supplied to an input node of said comparator or not to be supplied to said input node;
    a capacitor group consisting of an n (n is a natural number which is equal to or larger than 2) number of capacitors;
    a switch group consisting of an n number of switches which selectively connect said n number of capacitors in parallel to said input node of said comparator; and
    a control circuit which controls on/off operations of said switch and said n number of switches,
    wherein, in accordance with a result of the comparison by said comparator, said control circuit causes plural intermediate reference voltages to be generated at said input node of said comparator, and said comparator successively compares each of the intermediate reference voltages with the analog signal, the intermediate reference voltages being obtained by dividing the first and second reference voltages.

2. A successive approximation AD converter according to claim 1, wherein said capacitors of said capacitor group have a same capacitance.

3. A successive approximation AD converter according to claim 1, wherein each of said switch and said n number of switches is configured by a transmission gate.

4. A microcomputer into which a successive approximation AD converter according to claim 1 is incorporated.

5. A successive approximation AD converter in which an analog signal is successively compared with a reference voltage by a comparator to be converted into a digital signal, said converter comprising:
    a series resistor network which is configured by connecting in series resistors of a number required for obtaining an m-bit digital signal, and which generates plural reference voltages;
    a switch which switches the plural reference voltages generated by said series resistor network either to be supplied to an input node of said comparator or not to be supplied to said input node;
    a capacitor group consisting of an n (n is a natural number which is equal to or larger than 2) number of capacitors;
    a switch group consisting of an n number of switches which selectively connect said n number of capacitors in parallel to said input node of said comparator; and
    a control circuit which controls on/oft operations of said switch and said n number of switches,
    wherein, during a period when the analog signal is converted to a corresponding m-bit digital signal, said control circuit maintains said switch to an on state, and said n number of switches to an off state, and after the conversion is ended, controls on/off operations of said switch and said n number of switches in accordance with a result of the comparison by said comparator, thereby causing plural intermediate reference voltages to be generated at said input node of said comparator, the intermediate reference voltages being obtained by dividing the reference voltages generated by said series resistor network, and said comparator successively compares each of the intermediate reference voltages with the analog signal, thereby converting the analog signal into an (m+n)-bit digital signal.

6. A successive approximation AD converter according to claim 5, wherein said capacitors of said capacitor group have a same capacitance.

7. A successive approximation AD converter according to claim 5, wherein each of said switch and said n number of switches is configured by a transmission gate.

8. A microcomputer into which a successive approximation AD converter according to claim 5 is incorporated.

9. A successive approximation AD converter in which an analog signal is successively compared with a reference voltage by a comparator to be converted into a digital signal, said converter comprising:

a reference voltage generating circuit which generates plural reference voltages including first and second reference voltages V1 and V2;

a first switch which switches the plural reference voltages either to be supplied to an input node of said comparator or not to be supplied to said input node;

first and second capacitors;

second and third switches which selectively connect said first and second capacitors to said input node of said comparator; and a control circuit which controls on/off operations of said first, second, and third switches, wherein, in accordance with a result of the comparison by said comparator, said control circuit divides the first and second reference voltages V1 and V2, and causes plural intermediate reference voltages V indicated by a following expression:

$$V = V1 + \Delta V(A_n/2^n + A_{n-1}/2^{n-1} + \ldots + A_0/2)$$

where $\Delta V = V2 - V1$, $A_j$ (j=0 to n) is 0 or 1, and n is a natural number which is equal to or larger than 1, to be generated at said input node of said comparator, and said comparator successively compares each of the intermediate reference voltages V with the analog signal.

10. A successive approximation AD converter according to claim 9, wherein said first and second capacitors have a same capacitance.

11. A successive approximation AD converter according to claim 9, wherein each said first, second, and third switches is configured by a transmission gate.

12. A microcomputer into which a successive approximation AD converter according to claim 9 is incorporated.

* * * * *